(12) United States Patent
Suarez et al.

(10) Patent No.: US 10,819,364 B1
(45) Date of Patent: Oct. 27, 2020

(54) RADIATION HARDENED COMPACT MULTI-CHANNEL DIGITAL TO ANALOG CONVERTER

(71) Applicant: UNITED STATES OF AMERICA AS REPRESENTED BY THE ADMINISTRATOR OF NASA, Washington, DC (US)

(72) Inventors: George Suarez, Greenbelt, MD (US); Jeffrey Dumonthier, Greenbelt, MD (US); Nikolaos Paschalidis, Greenbelt, MD (US)

(73) Assignee: United States of America as represented by the Adminstrator of NASA, Washington, DC (US)

( * ) Notice: Subject to any disclaimer, the term of this patent is extended or adjusted under 35 U.S.C. 154(b) by 0 days.

(21) Appl. No.: 16/514,089

(22) Filed: Jul. 17, 2019

(51) Int. Cl.
  H03M 1/68 (2006.01)
  H03H 7/46 (2006.01)
  G08C 15/00 (2006.01)
  H03M 1/06 (2006.01)

(52) U.S. Cl.
  CPC ............ *H03M 1/687* (2013.01); *G08C 15/00* (2013.01); *H03H 7/463* (2013.01); *H03M 1/0607* (2013.01)

(58) Field of Classification Search
  CPC .... H03M 1/687; H03M 1/0607; G08C 15/00; H03H 7/463
  USPC .................................................. 341/141, 144
  See application file for complete search history.

(56) References Cited

U.S. PATENT DOCUMENTS

| | | | |
|---|---|---|---|
| 6,924,759 B2 * | 8/2005 | Wynne | H03M 1/1019 341/144 |
| 9,940,285 B2 * | 4/2018 | Alley | G06F 13/4221 |
| 10,120,829 B2 * | 11/2018 | Cox | G06F 13/362 |

* cited by examiner

*Primary Examiner* — Khai M Nguyen
(74) *Attorney, Agent, or Firm* — Christopher O. Edwards; Bryan A. Geurts; Helen M. Galus

(57) ABSTRACT

A radiation hardened, digital to analog converter includes first and second serial communication circuits, a common bus interface configured to connect the first and second serial communication circuits to first and second digital serial communication buses, respectively, and a digital to analog converter circuit, where the first and second serial communication circuits are configured to receive data over the first and second digital serial communication buses, respectively, for use by the digital to analog converter circuit.

14 Claims, 5 Drawing Sheets

RADIATION HARDENED COMPACT MULTI-CHANNEL DIGITAL TO ANALOG CONVERTER

INVENTION BY GOVERNMENT EMPLOYEE(S) ONLY

The invention described herein was made by one or more employees of the United States Government, and may be manufactured and used by or for the Government for governmental purposes without the payment of any royalties thereon or therefor.

ORIGIN OF THE INVENTION

Background

The disclosed embodiments generally relate to digital to analog conversion systems, and in particular, to a radiation hardened, multi-channel, digital to analog converter circuit with an integrated serial bus interface.

The need for space worthy, compact electronics that have reduced size, mass and power requirements as mission goals become more sophisticated. However, radiation in space affects all electronics due to, for example, long duration exposures, unpredictable solar proton activity, and a galactic cosmic ray environment. In addition, there is a need for a space worthy electrical interface between the electronics and spacecraft systems. Several serial bus protocols are available, in particular, the Inter-Integrated Circuit (I2C) and Serial to Parallel Interface (SPI) protocols. Both the I2C and SPI communication protocols provide on-chip capabilities which allow compatible devices to communicate directly with each other. The I2C and SPI systems both provide serial communication between a master unit and slave unit, but use different signals and different protocols. An I2C bus typically utilizes two signal lines, serial data (SDA) and serial clock (SCL), for serial bi-directional data transfers. An SPI bus typically utilizes four signal lines, slave select (SCS_n), serial clock (SCK), Master Out/slave In data input (MOSI), and Master In/Slave Out data output (MISO), for serial bi-bidirectional transfers. The busses have different configurations and operate with different protocols. As a result, an electronic device configured with an I2C interface is required for use in a system with an I2C bus, and the equivalent electronic device must be configured with an SPI interface in order to operate in a system with an SPI bus. For example, a digital to analog converter (DAC) coupled to an I2C interface is not usable in an SRI based system and the DAC coupled to an SRI interface is not usable in an I2C based system. It would be advantageous to provide a digital to analog conversion system that may be selectively coupled to both an I2C and an SRI communication system.

SUMMARY

The disclosed embodiments are directed to a radiation hardened, digital to analog converter, including first and second serial communication circuits, a common bus interface configured to connect the first and second serial communication circuits to first and second digital serial communication buses, respectively, and a digital to analog converter circuit, where the first and second serial communication circuits are configured to receive data over the first and second digital serial communication buses, respectively, for use by the digital to analog converter circuit.

The digital to analog converter circuit may include a resistive ladder architecture of 2N+1 resistors arranged in a two dimensional array, where N is the number of bits of a digital input of the digital to analog converter circuit.

The first serial communication circuit may include an inter-integrated circuit (I2C) communication circuit and the second serial communication circuit may include a serial to parallel interface (SRI) circuit.

The radiation hardened, digital to analog converter may include a first signal path between the common bus interface and the first serial communication circuit providing data for the digital to analog converter circuit utilizing a first communication protocol, and a second signal path between the common bus interface and the second serial communication circuit providing data for the digital to analog converter circuit utilizing a second communication protocol.

The first signal path may include I2C protocol signal lines and the second signal path may include SRI protocol signal lines.

The radiation hardened, digital to analog converter may include a signal line from the common bus interface having a first state for enabling the first serial communication circuit to receive data for the digital to analog converter over the first serial communication bus and disabling the second serial communication circuit, and a second state for disabling the first serial communication circuit and enabling the second serial communication circuit to receive data for the digital to analog converter over the second serial communication bus.

The radiation hardened, digital to analog converter may include a register bank connected between the first and second serial communication circuits and the digital to analog converter circuit, wherein the register bank is operable to store data from the first and second serial communication circuits and couple the data to the digital to analog converter circuit.

The radiation hardened, digital to analog converter may include a multiplexer coupled between the first and second serial communication circuits and the register bank, wherein the multiplexer includes an input connected to the common bus interface signal line and wherein the multiplexer is configured to connect a third signal path providing data for the digital to analog converter from the first serial communication circuit to the register bank when the common bus interface signal is in the first state, and connect a fourth signal path providing data for the digital to analog converter from the second serial communication circuit to the register bank when the common bus interface signal is in the second state.

The register bank may include a read/write register, a read only register, and decoder circuitry that, upon receiving a specially designated address to which data is to be written, transfers data from the read/write register to the read only register.

The register bank may include an output that couples the data in the read only register to the digital to analog converter circuit.

The disclosed embodiments are also directed to a method of digital to analog conversion, including receiving digital data using one of a first and second serial communication circuit, wherein the first serial communication circuit is configured to receive the digital data over a first digital serial communication bus utilizing a first serial communication protocol, and the second serial communication circuit is configured to receive the digital data over a second digital serial communication bus utilizing a second serial communication protocol, and converting the digital data to an analog signal using a digital to analog converter circuit.

The first serial communication circuit may include an inter-integrated circuit (I2C) communication circuit and the second serial communication circuit may include a serial to parallel interface (SPI) circuit.

The method of digital to analog conversion may include enabling the first serial communication circuit to receive data for the digital to analog converter over the first serial communication bus and disabling the second serial communication circuit when a signal from an interface common to the first and second digital serial communication buses, is in a first state, and disabling the first serial communication circuit and enabling the second serial communication circuit to receive data for the digital to analog converter over the second serial communication bus, when the signal from the interface common to the first and second digital serial communication buses, is in a second state.

The method of digital to analog conversion may include storing the data from the first and second serial communication circuits in a read/write register of a register bank.

The method of digital to analog conversion may include multiplexing the data from the first serial communication circuit to the read/write register of the register bank when the signal from the interface is in the first state, and multiplexing the data from the second serial communication circuit to the read/write register of the register bank when the signal from the interface is in the second state.

The method of digital to analog conversion may include transferring data from the read/write register to a read only register of the register bank upon receiving a specially designated address to which data is to be written.

The method of digital to analog conversion may include coupling the data in the read only register to the digital to analog converter circuit.

BRIEF DESCRIPTION OF THE DRAWINGS

The foregoing aspects and other features of the embodiments are explained in the following description, taken in connection with the accompanying drawings, wherein.

DETAILED DESCRIPTION

Figure 1:
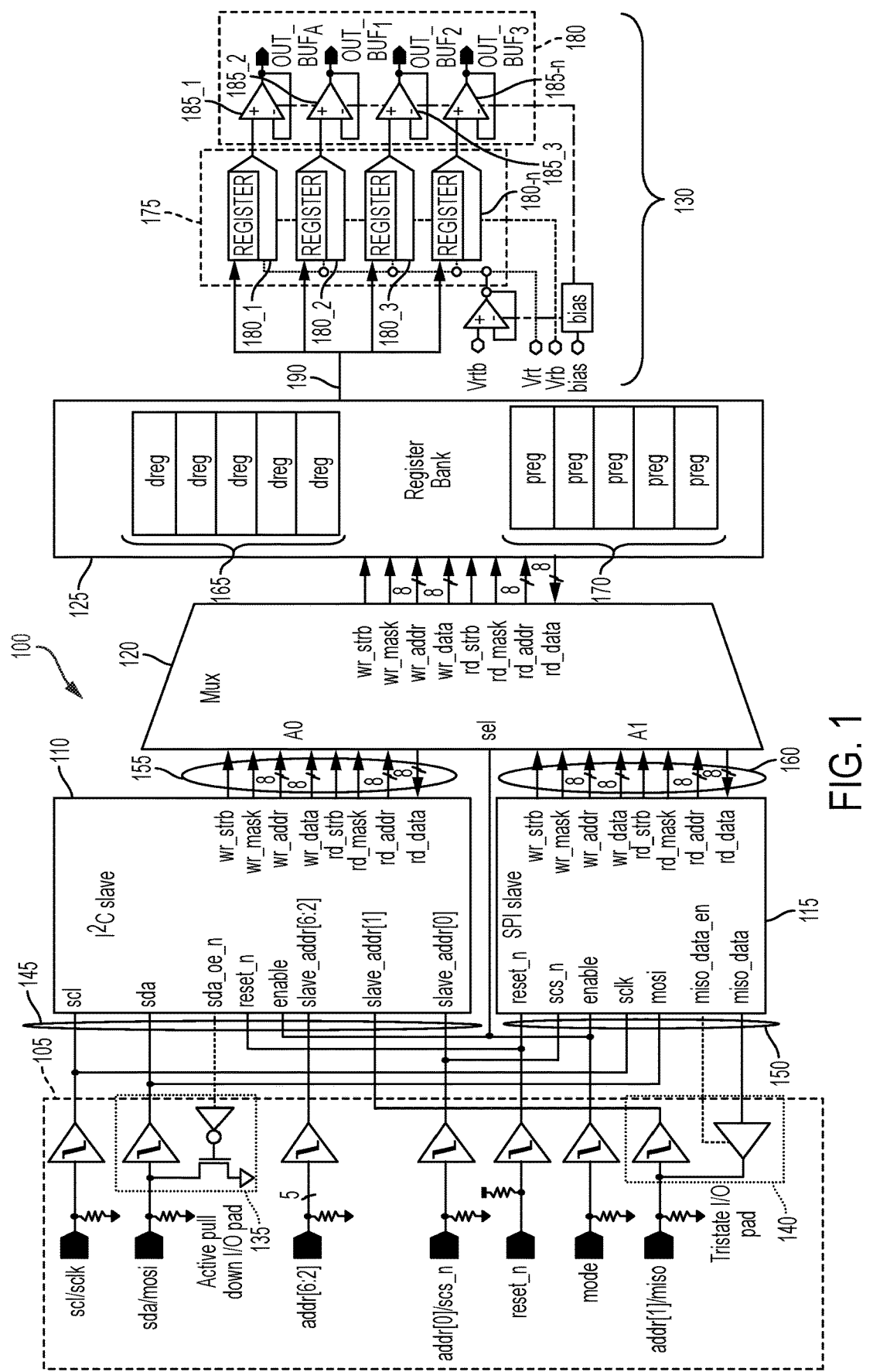
FIG. 1 illustrates an example of a digital to analog conversion system with a dual I2C and SRI interface according to the disclosed embodiments.

Although the disclosed embodiments will be described with reference to the embodiments shown in the drawings and described below, it should be understood that these could be embodied in many alternate forms. In addition, any suitable size, shape or type of elements or materials could be used.

FIG. 1 illustrates an example of a digital to analog conversion system 100 with a dual I2C and SPI interface according to the disclosed embodiments. In one or more embodiments, the digital to analog conversion system 100 may be implemented as part of an integrated circuit, for example, a Field Programmable Gate Array (FPGA), or an Application Specific Integrated Circuit (ASIC). A hardware description language may be used to describe the structure and operation of the interface, determine an architecture and logic gate layout, and then may be used to establish interconnections in the FPGA, or used to fabricate the ASIC. The digital to analog conversion system 100 may include a common bus interface circuit 105, communication circuitry configured as an I2C slave communication circuitry 110, communication circuitry configured as an SPI slave 115, a multiplexer 120, a register bank 125 for exchanging data and control signals, and a digital to analog conversion circuit 130. The digital to analog conversion circuit 130 may include one or more digital to analog converters 180_1-$n$, each with a buffer amplifier 185_1-$n$. In some embodiments, the common bus interface circuit 105, the I2C slave communication circuitry 110, the SPI slave communication circuitry 115, the multiplexer 120, the register bank 125, and the digital to analog conversion circuit 130 may be implemented as individual integrated circuits, a combination of integrated circuits that may include different components of the digital to analog conversion system 100, or as a single integrated circuit. The digital to analog conversion system 100 may be radiation hardened by design and, as such, may include enclosed NMOS transistors, guard rings around critical conductors and circuits, and triple voted flip flops to compensate for space radiation induced errors. The digital to analog conversion system 100 may be radiation hardened to >300 krad TID and may have an SEL>LET 120 MeV-sq. cm/mg.

The common bus interface circuit 105 generally provides signals between an I2C bus or an SPI bus and the I2C slave communication circuitry 110 and the SPI slave communication circuitry 115. The common bus interface circuit 105 may include one or more connectors, signal lines, pull up or pull down resistors, drivers, tri-state buffers, or other circuitry suitable for providing electrical pathways between the I2C and SPI busses and the I2C slave communication circuitry 110 and the SPI slave communication circuitry 115.

The disclosed I2C slave communication circuitry 110 may have a first signal path 145 that provides I2C protocol signals between the I2C slave communication circuitry 110 and the common bus interface circuit 105. The first signal path 145 may utilize an enable signal line ENABLE_I2C which may selectively enable the I2C slave communication circuitry 110, a serial data signal line SDA for bi-directional data communication between the I2C slave communication circuitry 110 and the at least one I2C master, a serial clock signal line SCL that provides a common clock from the at least one I2C master, a reset signal line RESET_I2C to reset registers and outputs, and 7 address lines SLAVE_ADDR [6:0]. In some embodiments, the I2C slave communication circuitry 110 may be implemented without a sampling clock and may include circuitry for determining I2C control events such as START, STOP, and RESTART by using the serial data signal line SDA and the serial clock signal line SCL.

The disclosed SPI slave communication circuitry 115 may have a first signal path 150 that operates according to an SPI protocol. The first signal path 150 may utilize an enable signal line ENABLE_SPI which may selectively enable the SPI slave communication circuitry 115, a slave select signal line SCS_n that provides a slave select signal from the SPI master, a serial clock signal line SCK that provides a common clock from the SPI master, a Master Out/Slave In data input signal line MOSI for receiving data from the SPI master, a Master In/Slave Out data output signal line MISO for providing data from the SPI slave communication circuitry 115 to the SPI master, and a reset signal line RESET_SPI to reset registers and outputs.

The common bus interface circuit 105 may couple to an I2C bus or an SPI bus, and may provide the following signal lines between the common bus interface circuit 105 and the first signal paths 145, 150 of the I2C and SPI slave communication circuitry 110, 115:

Signal line RESET_N provides the RESET_I2C signal to the I2C slave communication circuitry 110 and the RESET_SPI signal to the SPI slave communication circuitry 115. The RESET_N signal may be a two state, active low signal and may cause the I2C slave communication circuitry 110 and the SPI slave communication circuitry 115 to reset all registers and outputs.

Signal line MODE provides the ENABLE_I2C signal to the I2C slave communication circuitry 110 and the ENABLE_SPI signal to the SPI slave communication circuitry 115. The MODE signal may be a two state signal, and may selectively enable the I2C slave communication circuitry 110 and disable the SRI slave communication circuitry 115 in a first state, and enable the SRI slave communication circuitry 115 and disable the I2C slave communication circuitry 110 in a second state.

Signal line SCL/SCK provides the serial clock SCL signal to the I2C slave communication circuitry 110 and the serial clock SCK signal to the SRI slave communication circuitry 115.

Signal line SDA/MOSI provides the serial data SDA signal to the I2C slave communication circuitry 110 and the Master Out/Slave In data input MOSI signal to the SRI slave communication circuitry 115. The common bus interface circuit 105 may include an active pull down tri-state buffer 135 connected to the SDA/MOSI signal line and controlled by the I2C slave communication circuitry 110 for sending data to at least one I2C master over the SDA signal line.

Signal line ADDR[0]/SS provides the SLAVE_ADDR [0] signal to the I2C slave communication circuitry 110 and the slave select SCS_n signal to the SRI slave communication circuitry 115.

Signal line ADDR[1]/MISO provides the SLAVE_ADDR [1] signal to the I2C slave communication circuitry 110 and provides the output signal line MISO from the SRI slave communication circuitry 115 to the interface circuit 105. The common bus interface circuit 105 may include a tri-state buffer 140 connected to the ADDR[1]/MISO signal line and controlled by the SRI slave communication circuitry 115 for sending data to the SRI master over the MISO signal line.

Signal lines ADDR[6:2] provide the SLAVE_ADDR[6:2] signals to the I2C slave communication circuitry 110. It should be noted that the ADDR[6:2] signal lines are tied to a high voltage or to a low voltage to assign an I2C address to the dual I2C and SRI device interface 100.

Each of the I2C and SRI slave communication circuits 105, 110 may include a second signal path 155, 160 for exchanging information with the register bank 125 through the multiplexer I2C. The second signal path 155, 160 for each slave circuit may include the following signals:

A write strobe signal line WR_STRB, generated by each of the slave circuits circuit 105, 110 and used to write to the registers in the register bank 125, A write mask signal line WR_MASK, generated by each of the slave circuits circuit 105, 110 and used as an enable signal to allow writing to the registers in the register bank 125. When asserted low, the WR_MASK signal disables the WR_STRB signal, Eight write address signal lines WR_ADDR[7:0], generated by each of the slave circuits circuit 105, 110, designating the address in the register bank to be written, Eight write data signal lines WR_DATA[7:0] generated by each of the slave circuits circuit 105, 110 containing the data to be written to the WR_ADDR[7:0] address, A read strobe signal line RD_STRB, generated by each of the slave circuits circuit 105, 110 and used to read from the registers in the register bank 125, A read mask signal line RD_MASK, generated by each of the slave circuits circuit 105, 110 and used as an enable signal to allow reading from the registers in the register bank 125. When asserted low, the RD_MASK signal disables the RD_STRB signal, Eight read address signal lines RD_ADDR[7:0] generated by each of the slave circuits circuit 105, 110, designating the address in the register bank to be read, Eight read data signal lines RD_DATA[7:0] generated by the register bank 125 containing data read from the RD_ADDR[7:0] address.

Signal line MODE from the common bus interface circuit 105 provides a select signal to the multiplexer for selectively coupling the second signal path 155 of the I2C slave circuit 110 to the register bank 125, or coupling the second signal path 160 of the SPI slave circuit 115 to the register bank 125.

The register bank 125 may be configured as any set of registers suitable for storing information from the multiplexer 120, providing information to the digital to analog conversion circuit 130, and for providing information to the multiplexer. In some embodiments, the register bank may be configured with one or more read only data registers 165 designated dreg[xx:xx], and one or more read/write registers 170 designated preg[xx:xx], where [xx:xx] indicates the number of the last bit and the number of the first bit of each register, respectively. In one or more embodiments, the read only register dreg 165 and the read/write register preg 170 may be configured as an 80 bit register, e.g., dreg[79:00] and preg[79:00], however, it should be understood that the dreg 165 and preg 170 registers may be configured with any suitable number of bits. The register bank 125 may also be configured to allow read and write operations to the preg register 170 and may include decoder circuitry that, upon receiving a specially designated address to which data is to be written, may transfer data from the preg register 170 to the dreg register 165. The register bank 125 may have a signal path 190 for providing data to the digital to analog conversion circuit 130. In at least one embodiment, the signal path 175 provides the contents of the read only data register dreg 165 in parallel to the digital to analog conversion circuit 130

The I2C slave communication circuitry 110 becomes operational when the MODE signal from the common bus interface providing the ENABLE_I2C signal to the I2C slave communication circuitry 110 is asserted in the first state. The I2C slave communication circuitry 110 may read from and write to the read/write register preg 170, and read from the read only data register dreg 165 in the register bank 125, using a single byte, 8 bit format. When the I2C slave communication circuitry 110 performs a write transaction to address 8'FF (255) in the data register 125, a load signal is generated in the register bank 125 that loads the contents of the read/write register preg 170 into the read only data register dreg 165. Table 1 below illustrates exemplary I2C slave communication circuitry 110 read and write transactions when the read only register dreg 165 and the read/write register preg 170 are configured as 80 bit registers.

TABLE 1

| I2C SubAddr | R/W or R | Register | Operation description |
|---|---|---|---|
| 11111111 | W | N/A | Generates load_dacs signal to load dreg<=preg |
| 00010011 | R | dreg[79:72] | Reads hi-byte from spare register |
| 00010010 | R | dreg[71:64] | Reads lo-byte from spare register |
| 00010001 | R | dreg[63:56] | Reads hi-byte from DAC Ch #3 register |
| 00010000 | R | dreg [55:48] | Reads lo-byte from DAC Ch #3 register |
| 00001111 | R | dreg[47:40] | Reads hi-byte from DAC Ch #2 register |
| 00001110 | R | dreg[39:32] | Reads lo-byte from DAC Ch #2 register |
| 000001101 | R | dreg[31:24] | Reads hi-byte from DAC Ch #1 register |
| 00001100 | R | dreg[23:16] | Reads lo-byte from DAC Ch #1 register |
| 00001011 | R | dreg[15:8] | Reads hi-byte from DAC Ch #0 register |
| 00001010 | R | dreg[7:0] | Reads lo-byte from DAC Ch #0 register |
| 00001001 | R/VV | preg[79:72] | Read/Write hi-byte from/to temp spare register |
| 00001000 | R/VV | preg[71:64] | Read/Write lo-byte from/to temp Spare register |
| 00000111 | R/VV | preg[63:56] | Read/Write hi-byte from/to temp DAC Ch #3 register |
| 00000110 | R/VV | preg[55:48] | Read/Write lo-byte from/to temp DAC Ch #3 register |
| 00000101 | R/VV | preg[47:40] | Read/Write hi-byte from/to temp DAC Ch #2 register |
| 00000100 | R/VV | preg[39:32] | Read/Write lo-byte from/to temp DAC Ch #2 register |
| 00000011 | R/VV | preg[31:24] | Read/Write hi-byte from/to temp DAC Ch #1 register |
| 00000010 | R/VV | preg[23:16] | Read/Write lo-byte from/to temp DAC Ch #1 register |
| 00000001 | R/VV | preg[15:8] | Read/Write hi-byte from/to temp DAC Ch #0 register |
| 00000000 | R/VV | preg[7:0] | Read/Write lo-byte from/to temp DAC Ch #0 register |

Figure 2:
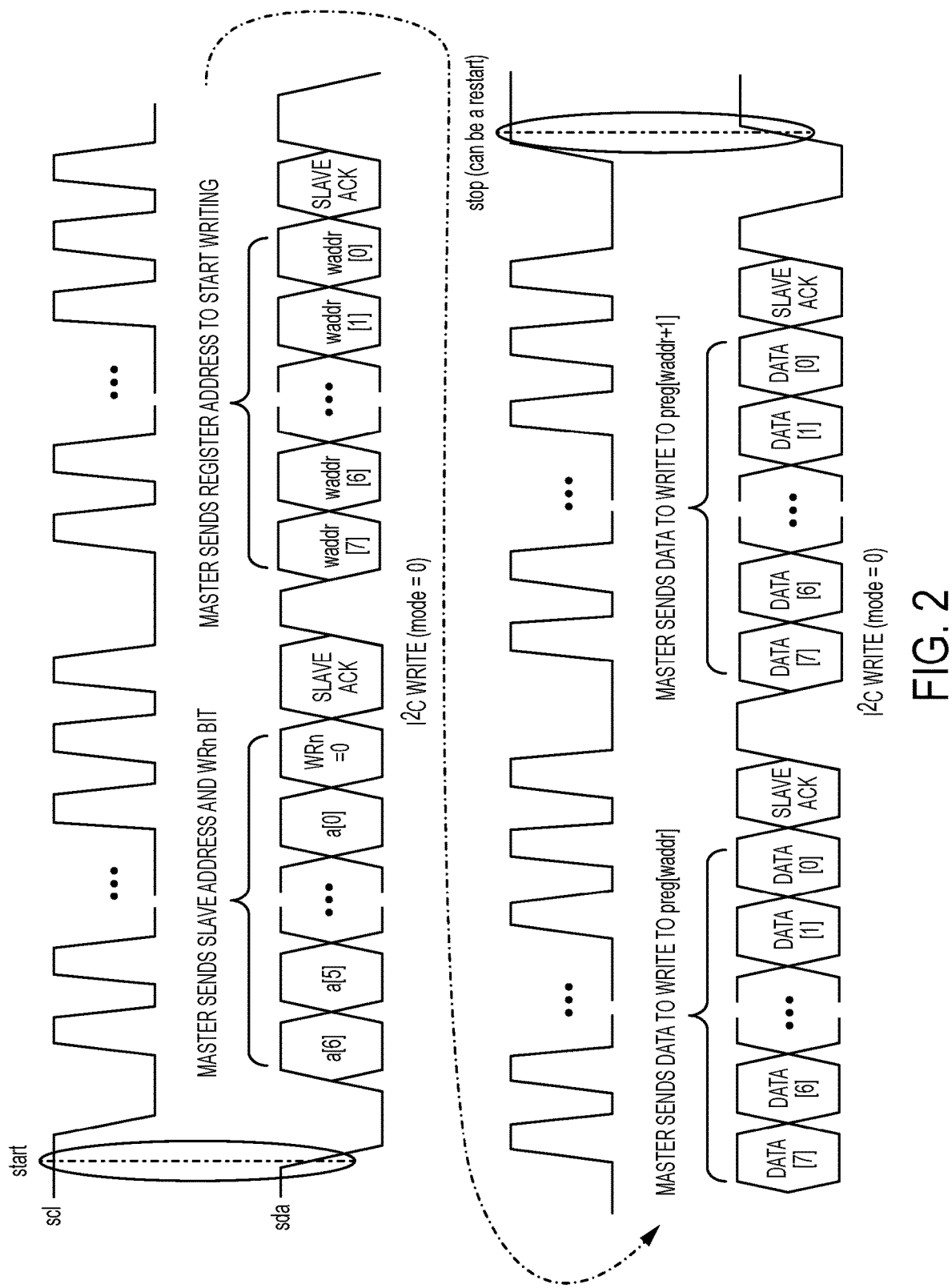
FIG. 2 shows an example of an I2C slave transaction that writes data to a register bank in response to commands and data sent from an I2C master.

FIG. 2 shows an example of an I2C slave transaction that writes data to the read/write register preg 170 in the register bank 125 in response to commands and data sent from an I2C master on the serial data SDA signal line. The I2C master sends a slave address and a write bit. Upon recognizing the slave address, the I2C slave communication circuitry 110 responds with an acknowledge bit. The I2C master then sends an initial register address (e.g., an I2C SubAddr from Table 1) at which to begin writing. Upon receiving the initial register address, the I2C slave communication circuitry 110 responds with an acknowledge bit. The I2C master then sends data to be written to the initial register address, and then sends data to be written to subsequent consecutive addresses. Upon receipt of each byte, the I2C slave communication circuitry 110 responds with an acknowledge bit and writes the data to the corresponding address in the read/write register preg 170 in the register bank 125. The transaction continues until the I2C master sends a stop or restart command.

Figure 3:
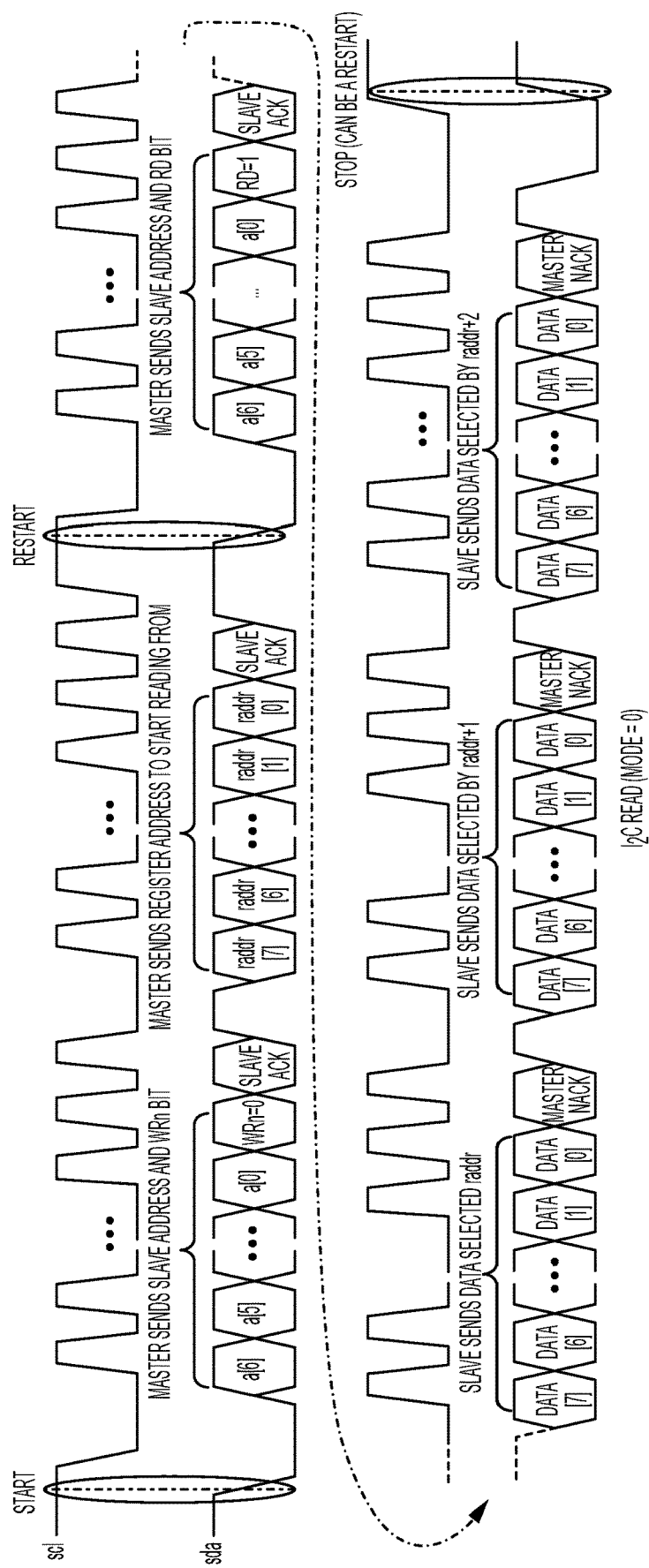
FIG. 3 shows an example of an I2C slave transaction that reads data from a register bank in response to commands from an I2C master.

FIG. 3 shows an example of an I2C slave transaction that reads data from the read only data register dreg 165 in the register bank 125, or from the read/write register preg 170 in the register bank 125, in response to commands from an I2C master on the serial data SDA signal line. The I2C master sends a slave address and a write bit. Upon recognizing the slave address, the I2C slave communication circuitry 110 responds with an acknowledge bit. The I2C master then sends an initial register address (e.g., an I2C SubAddr from Table 1) from which to begin reading. Upon receiving the initial register address, the I2C slave communication circuitry 110 again responds with an acknowledge bit. The I2C master then sends the slave address again with a read bit which is acknowledged by the I2C slave. The I2C slave then sends the data from the address in the read/write register preg 170 corresponding to the initially specified register address and then sends data from subsequent consecutive addresses. Upon receipt of each data byte, the I2C master responds with an acknowledge bit. The transaction continues until the I2C master sends a stop or restart command.

The SRI slave communication circuitry 115 becomes operational when the MODE signal from the common bus interface providing the ENABLE_SPI signal to the SRI slave communication circuitry 115 is asserted in the second state. The SRI slave communication circuitry 115 may read from and write to the read/write register preg 170, and read from the read only data register dreg using a two byte, 16 bit format. When the SRI slave communication circuitry 115 performs a write transaction to address F (1111) in the data register 125, a load signal is generated in the register bank 125 that loads the contents of the read/write register preg 170 into the read only data register dreg 165. Table 2 below illustrates exemplary SRI slave communication circuitry read and write transactions when the read only register dreg 165 and the read/write register preg 170 are configured as 80 bit registers.

TABLE 2

| SPI RDn/WR | SPI SubAddr | Register | Operation description |
|---|---|---|---|
| 1 | All Others | N/A | SPI returns 16'h BAAD |
| 1 | 0100 | preg[39:32] | Read/Write from/to temp Spare register |
| 1 | 0011 | preg[31:24] | Read/Write from/to temp DAC Ch #3 register |
| 1 | 0010 | preg[23:16] | Read/Write from/to temp DAC Ch #2 register |
| 1 | 0001 | preg[15:8] | Read/Write from/to temp DAC Ch #1 register |
| 1 | 0000 | preg[7:0] | Read/Write from/to temp DAC Ch #0 register |
| 0 | 1001 | dreg[79:64] | Read from temp Spare register |
| 0 | 1000 | dreg[63:48] | Read from temp DAC Ch #3 register |
| 0 | 0111 | dreg [47:32] | Read from temp DAC Ch #2 register |
| 0 | 0110 | dreg[31:16] | Read from temp DAC Ch #1 register |

TABLE 2-continued

| SPI RDn/WR | SPI SubAddr | Register | Operation description |
|---|---|---|---|
| 0 | 0101 | dreg[15:00] | Read from temp DAC Ch #0 register |
| 0 | 0100 | preg[79:64] | Read/Write from/to temp Spare register |
| 0 | 0011 | preg[63:48] | Read/Write from/to temp DAC Ch #3 register |
| 0 | 0010 | preg[47:32] | Read/Write from/to temp DAC Ch #2 register |
| 0 | 0001 | preg[31:16] | Read/Write from/to temp DAC Ch #1 register |
| 0 | 0000 | preg[15:00] | Read/Write from/to temp DAC Ch #0 register |

Figure 4A:
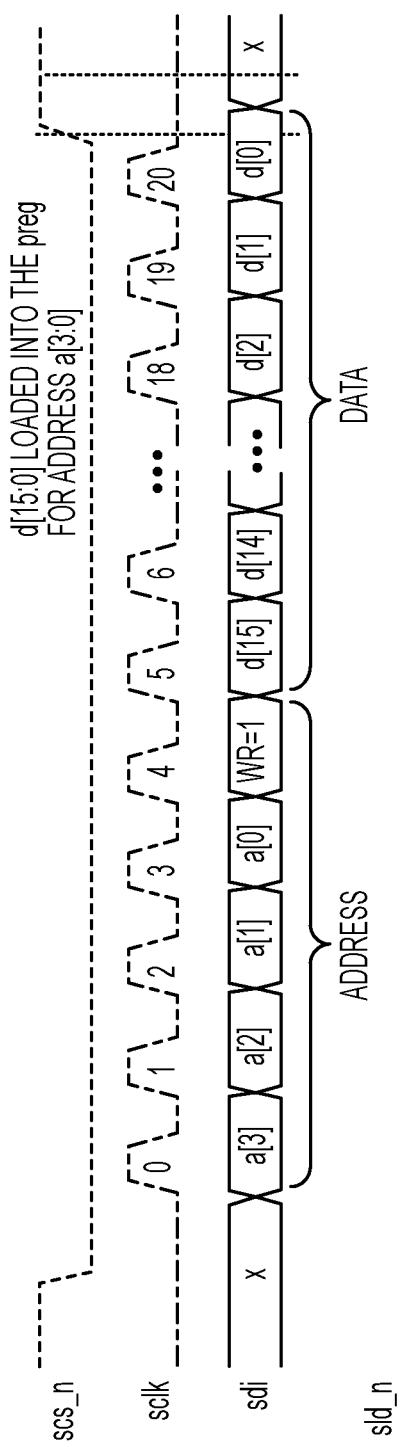
FIGS. 4A and 4B show examples of SRI slave transactions that write data to a register bank in response to commands and data sent from an SRI master.
Figure 4B:
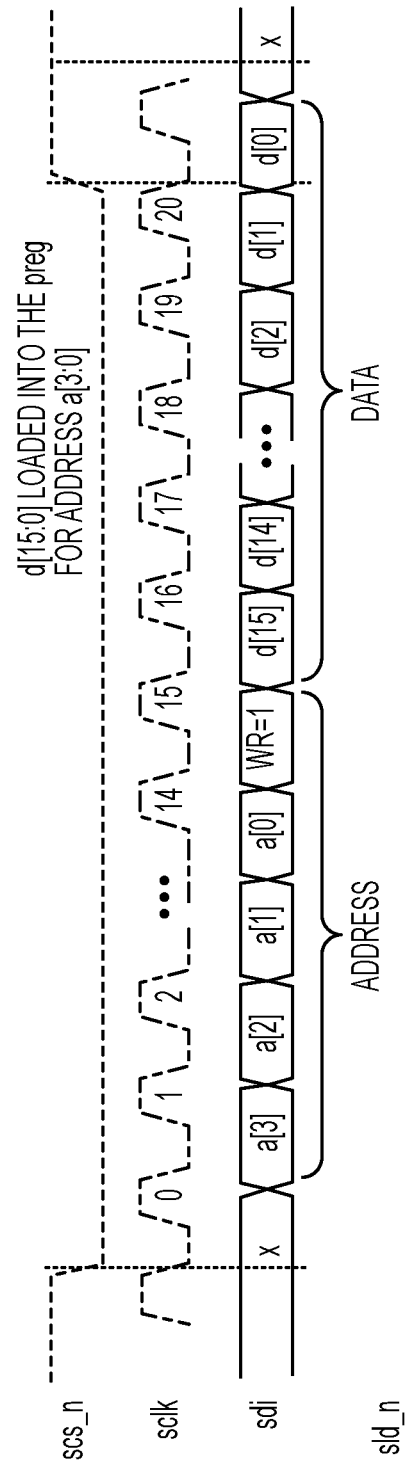

FIGS. 4A and 4B show examples of SRI slave transactions that write data d[15:0] to an exemplary location address (SRI SubAddr in Table 2) in the read/write register preg 170 in the register bank 125, in response to commands and data sent from an SRI master. FIG. 4A shows exemplary transactions where the SRI slave master provides the serial clock SCL signal only for the duration of the data transfer, while FIG. 4B shows exemplary transactions where the SRI slave master provides the serial clock SCL signal as a constantly running clock. The SRI master initiates the transaction by asserting the slave select SCS_n signal. The SRI master then sends an initial register address (e.g., an SRI SubAddr from Table 2) at which to begin writing data and a write bit on the MOSI signal line. The SRI master then sends data on the MOSI signal line to be written to the initial register address. The SRI master then sends the next register address at which to begin writing with a write bit on the MOSI signal line, and then sends data on the MOSI signal line to be written to the next register address. The SRI master continues to send address and data pairs until the desired number of read/write registers preg have been written.

Figure 5A:
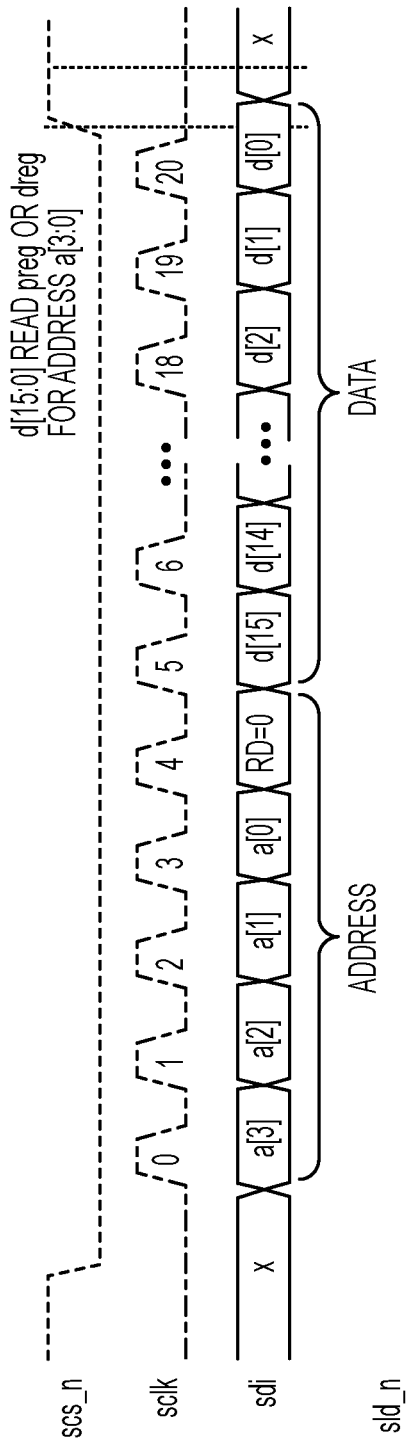
FIGS. 5A and 5B show examples of SRI slave transactions that read data from a register bank in response to commands from an SRI master.
Figure 5B:
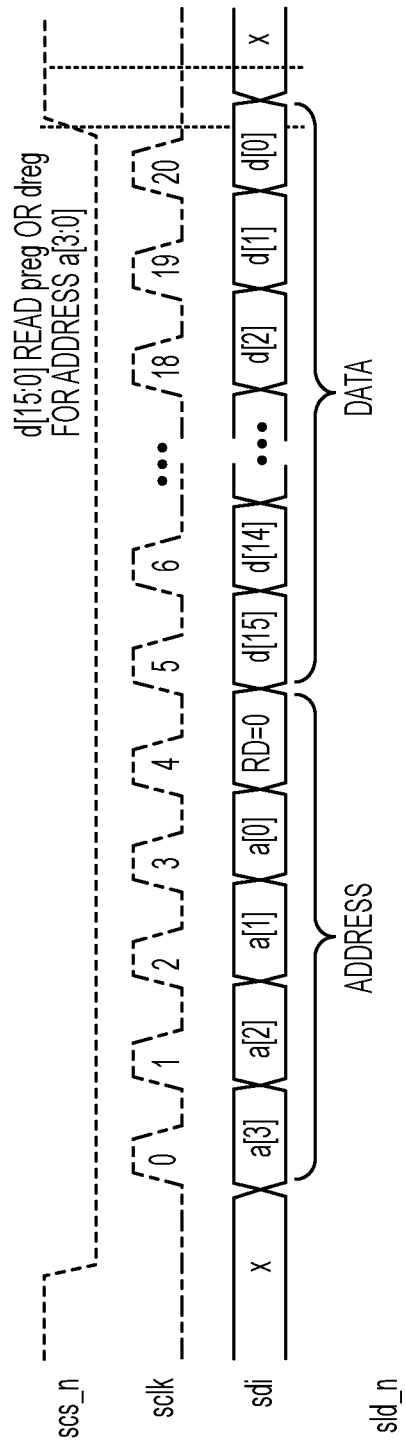

FIGS. 5A and 5B show examples of SRI slave transactions that read data from the read only data register dreg 165 in the register bank 125, or from the read/write register preg 170 in the register bank 125, in response to commands from an SRI master. FIG. 5A shows exemplary transactions where the SRI slave master provides the serial clock SCL signal only for the duration of the data transfer, while FIG. 5B shows exemplary transactions where the SRI slave master provides the serial clock SCL signal as a constantly running clock. The SRI master initiates the transaction by asserting the slave select SCS_n signal. The SRI master then sends an initial register address (e.g., an SRI SubAddr from Table 2) at which to begin reading data and a read bit on the MOSI signal line. The SRI slave 115 then sends the data from the initial register address to the SRI master on the MISO signal line. The SRI master then sends the next register address at which to read data with a read bit on the MOSI signal line, and the SRI slave responds with the data from the specified register. The SRI master continues to send addresses from which to read, and the SRI slave continues to provide data from the registers until the desired number of register bits have been read.

Referring again to FIG. 1, the digital to analog conversion circuit 130 may include one or more digital to analog converters 180_1-n. One or more embodiments may utilize a resistive ladder architecture, also known as a "string" DAC. The resistive ladder architecture may include 2N+1 resistors in a two dimensional array, where N is the number of bits of the digital input, for example 12, connected between a top reference voltage Vrt and a bottom reference voltage Vrb. One set of switches may be connected in rows between nodes of the resistive ladder and the output, and another set of switches may be connected between a supply voltage and the first resistor in each column. The least significant bit (LSB) in volts and the output of the analog conversion circuit 130 are defined by:

$$LSB=(Vrt-Vrb)/2N$$

$$Vout=Din*(Vrt-Vrb)/2N+Vrb$$

where Din is the DAC input, N is the number of bits (for example, 12) and LSB is the minimum voltage step. The output may range from Vrb to Vrt-LSB. Table 3 shows LSB values for different exemplary ranges of reference voltages.

TABLE 3

| Vrt(V) | Vrb(V) | LSB(uV) |
|---|---|---|
| 3 | 0 | 732.42 |
| 2.5 | 0 | 610.35 |
| 2 | 0 | 488.28 |

In one or more embodiments, the arrangement of the switches and resistors in the row and column architecture greatly simplifies the decoder logic used to decode the binary input.

As mentioned above, the contents of the read only data register dreg 165 is provided to the digital to analog conversion circuit 130. The outputs from the digital to analog converters 180_1-n may be connected to buffer amplifiers 185_1-n. In some embodiments, the buffer amplifiers 185_1-n may provide the outputs from the digital to analog converters 180_1-n directly. Alternately, the buffer amplifiers 185_1-n may be individually configured as one or more operational amplifiers, trans-conductance amplifiers, or any combination of amplifiers, buffer circuitry, or other suitable circuitry. A bias voltage designated "bias" may be supplied to the buffer amplifiers 185_1-n to provide a predetermined offset.

The disclosed embodiments thus provide a digital serial communication system that provides a common bus interface, selectable circuitry that operates as an I2C slave or an SRI slave, a register bank for exchanging data and control signals with the I2C slave or the SRI slave and one or more electronic devices, and a multiplexer that provides signal paths for the data and control signals between the I2C slave or the SRI slave and the register bank.

It is noted that the embodiments described herein can be used individually or in any combination thereof. It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

Various modifications and adaptations may become apparent to those skilled in the relevant arts in view of the foregoing description, when read in conjunction with the accompanying drawings. However, all such and similar modifications of the teachings of the disclosed embodiments will still fall within the scope of the disclosed embodiments.

Various features of the different embodiments described herein are interchangeable, one with the other. The various described features, as well as any known equivalents can be mixed and matched to construct additional embodiments and techniques in accordance with the principles of this disclosure.

Furthermore, some of the features of the exemplary embodiments could be used to advantage without the corresponding use of other features. As such, the foregoing description should be considered as merely illustrative of the principles of the disclosed embodiments and not in limitation thereof.

The invention claimed is:

1. A radiation hardened, digital to analog converter, comprising:
   first and second serial communication circuits;
   a common bus interface configured to connect the first and second serial communication circuits to first and second digital serial communication buses, respectively;
   a digital to analog converter circuit; and
   a register bank connected between the first and second serial communication circuits and the digital to analog converter circuit, wherein the register bank is operable to store data from the first and second serial communication circuits and couple the data to the digital to analog converter circuit;
   wherein the first and second serial communication circuits are configured to receive data over the first and second digital serial communication buses, respectively, for use by the digital to analog converter circuit.

2. The radiation hardened, digital to analog converter of claim 1, wherein the digital to analog converter circuit comprises a resistive ladder architecture of 2N+1 resistors arranged in a two dimensional array, where N is the number of bits of a digital input of the digital to analog converter circuit.

3. The radiation hardened, digital to analog converter of claim 1, wherein the first serial communication circuit comprises an inter-integrated circuit (I2C) communication circuit and the second serial communication circuit comprises a serial to parallel interface (SPI) circuit.

4. The radiation hardened, digital to analog converter of claim 3, comprising:
   a first signal path between the common bus interface and the first serial communication circuit providing data for the digital to analog converter circuit utilizing a first communication protocol; and
   a second signal path between the common bus interface and the second serial communication circuit providing data for the digital to analog converter circuit utilizing a second communication protocol.

5. The radiation hardened, digital to analog converter of claim 4, wherein the first signal path comprises I2C protocol signal lines and the second signal path comprises SPI protocol signal lines.

6. The radiation hardened, digital to analog converter of claim 1, comprising a signal line from the common bus interface having:
   a first state for enabling the first serial communication circuit to receive data for the digital to analog converter over the first serial communication bus and disabling the second serial communication circuit; and
   a second state for disabling the first serial communication circuit and enabling the second serial communication circuit to receive data for the digital to analog converter over the second serial communication bus.

7. The radiation hardened, digital to analog converter of claim 1, comprising
   a multiplexer coupled between the first and second serial communication circuits and the register bank, wherein the multiplexer includes an input connected to the common bus interface signal line and wherein the multiplexer is configured to:
   connect a third signal path providing data for the digital to analog converter from the first serial communication circuit to the register bank when the common bus interface signal is in the first state; and
   connect a fourth signal path providing data for the digital to analog converter from the second serial communication circuit to the register bank when the common bus interface signal is in the second state.

8. The radiation hardened, digital to analog converter of claim 7, wherein the register bank comprises:
   a read/write register;
   a read only register; and
   decoder circuitry that, upon receiving a specially designated address to which data is to be written, transfers data from the read/write register to the read only register.

9. The radiation hardened, digital to analog converter of claim 8, wherein the register bank comprises an output that couples the data in the read only register to the digital to analog converter circuit.

10. A method of digital to analog conversion, comprising:
    receiving digital data using one of a first and second serial communication circuit, wherein the first serial communication circuit is configured to receive the digital data over a first digital serial communication bus utilizing a first serial communication protocol, and the second serial communication circuit is configured to receive the digital data over a second digital serial communication bus utilizing a second serial communication protocol;
    converting the digital data to an analog signal using a digital to analog converter circuit; and
    enabling the first serial communication circuit to receive data for the digital to analog converter over the first serial communication bus and disabling the second serial communication circuit when a signal from an interface common to the first and second digital serial communication buses, is in a first state;
    disabling the first serial communication circuit and enabling the second serial communication circuit to receive data for the digital to analog converter over the second serial communication bus, when the signal from the interface common to the first and second digital serial communication buses, is in a second state; and
    storing the data from the first and second serial communication circuits in a read/write register of a register bank.

11. The method of claim 10, wherein the first serial communication circuit comprises an inter-integrated circuit (I2C) communication circuit and the second serial communication circuit comprises a serial to parallel interface (SPI) circuit.

12. The method of claim 10, further comprising:
    multiplexing the data from the first serial communication circuit to the read/write register of the register bank when the signal from the interface is in the first state; and multiplexing the data from the second serial communication circuit to the read/write register of the register bank when the signal from the interface is in the second state.

13. The method of claim 12, comprising transferring data from the read/write register to a read only register of the register bank upon receiving a specially designated address to which data is to be written.

14. The method of claim 12, comprising coupling the data in the read only register to the digital to analog converter circuit.

* * * * *